United States Patent [19]
Han

[11] Patent Number: 5,777,497
[45] Date of Patent: Jul. 7, 1998

[54] CMOS OUTPUT CIRCUIT WITH PRECHARGE CIRCUIT

[75] Inventor: Tae-Heum Han, Seoul, Rep. of Korea

[73] Assignee: LG Semicon Co., Ltd., Choongcheongbuk-do, Rep. of Korea

[21] Appl. No.: 770,230

[22] Filed: Dec. 19, 1996

[30] Foreign Application Priority Data

Dec. 21, 1995 [KR] Rep. of Korea ............... 1995 53431

[51] Int. Cl.[6] .................. H03K 17/04; H03K 19/094
[52] U.S. Cl. ................. 327/108; 327/384; 327/379; 326/26; 326/82
[58] Field of Search .......................... 327/108, 310, 327/311, 384, 379, 391, 112, 386; 326/58, 26, 27, 85, 82, 21

[56] References Cited

U.S. PATENT DOCUMENTS 4,864,243  9/1989  Reese .................... 327/19
4,988,888  1/1991  Hirose et al. ............ 307/443

*Primary Examiner*—Timothy P. Callahan
*Assistant Examiner*—Dinh Le
*Attorney, Agent, or Firm*—Morgan, Lewis & Bockius LLP

[57] ABSTRACT

A CMOS circuit includes an output unit for receiving an enable signal and an input data and producing an output signal. A transmission gate unit receives a precharge signal and the output signal from the output unit and transmits a corresponding signal in accordance with the precharge signal. A precharge unit having a data output terminal receives the corresponding signal from the transmission date unit and stores an electric charge. The precharge unit also maintains the electric charge at an intermediate level in accordance with the corresponding signal of the transmission gate unit and outputs data at the intermediate level.

22 Claims, 4 Drawing Sheets

FIG.2A CONVENTIONAL ART (OE)
FIG.2B CONVENTIONAL ART (PS1)
FIG.2C CONVENTIONAL ART (Din)
FIG.2D CONVENTIONAL ART (DP)
FIG.2E CONVENTIONAL ART (DN)
FIG.2F CONVENTIONAL ART (Dout)

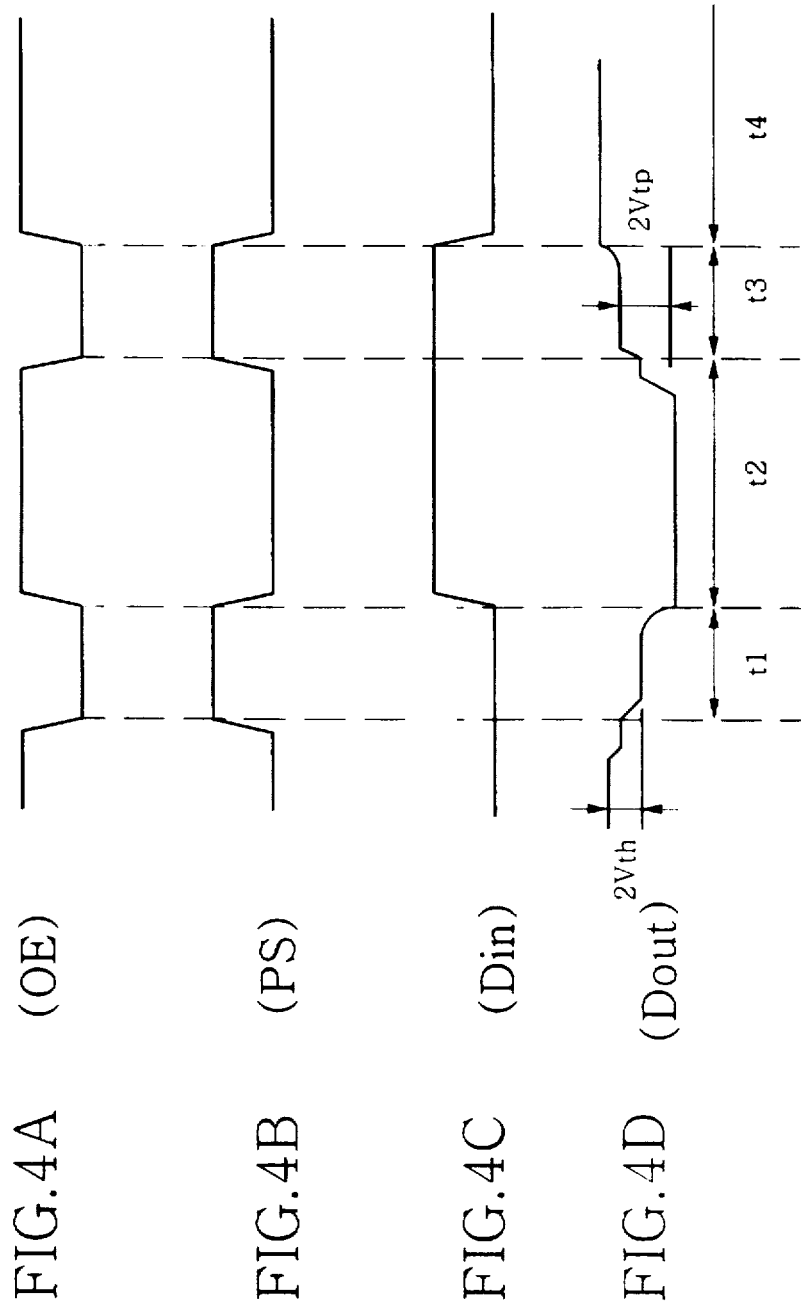

CMOS OUTPUT CIRCUIT WITH PRECHARGE CIRCUIT

BACKGROUND OF THE INVENTION

1. Field of the Invention

The present invention relates to a CMOS output circuit, and more particularly, to a CMOS output circuit having a precharge circuit.

2. Discussion of the Related Art

FIG. 1 shows a conventional CMOS output circuit equipped with a precharge circuit and includes a NAND gate 1 for performing a NAND operation ("NANDing") on an output enable signal OE and an input data Din. The NAND gate 1 outputs a first output control signal DP. A NOR gate 2 performs a NOR operation ("NORing") on an output enable signal OE inverted by an inverter 5 and an input data Din. The NOR gate 2 outputs a second output control signal DN. A setting unit 3 sets an electric charge of an output terminal Dout up to an intermediate level in accordance with a third output control signal PS1. An output unit 4 outputs a certain data, in accordance with output control signals DP and DN, in a state such that the output terminal Dout is fixed to an intermediate level of electric charge.

The NAND gate 1 includes a PMOS transistor Q5 connected between a voltage Vcc terminal and the ground in series, NMOS transistors Q7 and Q8, and PMOS transistor Q6. The PMOS transistor Q6 has the source connected to the voltage Vcc terminal and the drain connected to the output terminal of the NMOS transistor Q7. The output enable signal OE is connected to the gates of the PMOS transistor Q6 and the NMOS transistor Q8, and the data input Din terminal is connected to the PMOS transistor Q5 and the NMOS transistor Q7.

The NOR gate 2 includes serially connected PMOS transistors Q9 and Q10 and an NMOS transistor Q12 between the voltage Vcc and the ground, and an NMOS transistor Q11 having the drain connected to the output terminal of the NMOS transistor Q11 and the source connected to the ground. A data input Din terminal is connected to the gates of the PMOS transistor Q10 and the NMOS transistor Q11. An output enable signal OE terminal is connected to the gates of the PMOS transistor Q9 and the NMOS transistor Q12 through an inverter 5.

The intermediate electric charge setting unit 3 includes serially connected NMOS transistor Q2 and PMOS transistor Q1 between the NAND gate 1 and the output terminal of the NOR-gate 2. An inverter 6 is connected to the gate of the PMOS transistor Q1. The input terminal of the third output control signal PS1 is connected to the gate of the NMOS transistor Q2 and the inverter 6.

The output unit 4 includes a PMOS transistor Q3 and an NMOS transistor Q4 connected in series between the voltage Vcc and the ground. The gates thereof are connected respectively to the output terminals of the NAND gate 1 and the NOR gate 2. The output terminal of the output unit 4 is commonly connected to the output terminal of the intermediate electric charge setting unit 3 and a load capacitance CL.

The operation of the conventional CMOS output circuit equipped with a precharge circuit will now be explained with reference to FIGS. 1 and 2A–2F. FIGS. 2A–2F represent signals OE, PS1, Din, DP, DN, and Dout, respectively.

Referring to FIGS. 2A–2D, when a third output control signal PS1 is set from a low level to a high level (t1 of FIG. 2B), and when an output enable signal OE is set from a high level to a low level (t1 of FIG. 2A), the PMOS transistor Q6 of the NAND-gate 1 is turned on and the NMOS transistor Q12 of the NOR-gate 2 is turned on in accordance with a high level signal inverted by the inverter 5. Accordingly, a first output control signal DP becomes a high level and the second output control signal DN becomes a low level.

Therefore, since the PMOS transistor Q3 and the NMOS transistor Q4 of the output unit 4 are turned off in accordance with a high level first output control signal DP and a low level second output control signal DN, the output terminal Dout becomes a high level or a low level depending on whether the load capacitance CL is charged or discharged.

For example, when the output terminal Dout is at a low level (FIG. 2F), the NMOS transistor Q2 of the intermediate electric charge setting unit 3 is turned on in accordance with a high level third output control signal PS1 (t1 of FIG. 2B). Also, a charging current flows to the load capacitance CL through the NMOS transistor Q2 and increases electric charge of the output terminal Dout.

At this time, the electric charge of the first output control signal DP, as shown in FIG. 2D, temporarily enters a level lower than a high level Vcc when the NMOS transistor Q2 is turned on. When the decrease of the electric charge exceeds a threshold voltage Vtp of the PMOS transistor Q3, the PMOS transistor Q3 is turned on.

Therefore, a charging current flows to the load capacitance CL through the PMOS transistor Q3, and the electric charge of the output terminal Dout rapidly reaches the intermediate electric charge, as shown at t1 of FIG. 2F.

Meanwhile, when the third output control signal PS1 is increased up to a high level (t1 of FIG. 2B), the gate, drain and source of the PMOS transistor Q1 are all set to low levels, and the PMOS transistor Q1 is turned off. However, when the electric charge of the output terminal Dout is increased, and when the drain-source voltage exceeds the threshold voltage Vtp of the PMOS transistor Q1, the PMOS transistor Q1 is turned on. Accordingly, current flows through the NMOS transistor Q2 and the PMOS transistor Q1, and the second output control signal DN slowly starts increasing from a low level, as shown at t1 of FIG. 2E. However, since the channel resistance of the PMOS transistor Q1 is high, the increasing voltage does not reach up to the threshold voltage Vtn of the NMOS transistor Q4. Hence, the current flowing through the NMOS transistor Q2 and the PMOS transistor Q1 does not affect the output unit 4.

Thereafter, in a state where the output terminal Dout has reached the intermediate electric charge Vtp (t1 of FIG. 2F), a high level data (Din) from a sense amplifier (not shown) is inputted (t2 of FIG. 2C). Thus, the third output control signal PS1 and the output enable signal OE become a low level (t2 of FIG. 2B) and a high level (t2 of FIG. 2A), respectively. Accordingly, the NMOS transistors Q7, Q8 and Q9 are turned on. Also, the first output control signal DP (t2 of FIG. 2D) and the second output control signal DN (t2 of FIG. 2E) become low levels. Therefore, the PMOS transistor Q3 is turned on in accordance with a low level first output control signal DP, and a high level data is transmitted to the input/output apparatus I/O through the output terminal Dout (t2 of FIG. 2F).

Thereafter, when the output enable signal OE is converted to a low level (t3 of FIG. 2A) and the third output control signal PS1 is converted to a high level (t3 of FIG. 2B), the NMOS transistor Q2 and the PMOS transistor Q1 of the intermediate electric charge setting unit 3 are turned on in accordance with a high level third output control signal PS1.

Accordingly, the electric charge stored in the load capacitor CL becomes discharged.

Therefore, the electric charge of the output terminal Dout decreases from a high level (t3 of FIG. 2F), and the second output control signal DN (t3 of FIG. 2E) temporarily increases so as to turn on the NMOS transistor Q4. The electric charge stored in the load capacitor CL is discharged through the turned-on NMOS transistor Q4, and the output terminal Dout quickly reaches the intermediate electric charge Vth.

Meanwhile, the electric charge of the output terminal Dout is decreased. When the voltage between the drain and the source of the NMOS transistor Q2 exceeds the threshold voltage, the NMOS transistor Q2 is turned on. At this time, the passing-through voltage is relatively small because the channel resistance of the NMOS transistor Q2 is greater than that of the PMOS transistor Q1 due to a substrate bias effect. Hence, the first output control signal DP starts decreasing from a high level (t3 of FIG. 2D).

Since the channel resistance of the NMOS transistor Q2 is high and the decreased level of the electric charge does not exceed the threshold voltage Vtp of the PMOS transistor Q3, the current passing through the PMOS transistor Q1 and the NMOS transistor Q2 does not effect the output unit 4. Also, the conventional CMOS output circuit equipped with a precharge circuit has an advantage in transmitting data at a high speed because the data transmission is performed at an intermediate electric charge level in accordance with an output enable signal. However, there exists a certain time duration where the PMOS transistor Q3 and the NMOS transistor Q4 of the output unit are concurrently turned on. Hence, much of the passing-through current concurrently flows toward the ground terminal from the electric power voltage terminal Vcc, which produces noise. Thus, a desired data transmission cannot be achieved.

SUMMARY OF THE INVENTION

Accordingly, the present invention is directed to a CMOS output circuit with a precharge circuit, that substantially obviates one or more of the problems due to limitations and disadvantages of the related art.

An object of the present invention is to provide an improved CMOS output circuit with a precharge circuit capable of advantageously reducing current noise when outputting data.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a circuit includes an output unit for receiving an enable signal and an input data and producing an output signal; a transmission gate unit for receiving a precharge signal and the output signal from the output unit and transmitting a corresponding signal in accordance with the precharge signal; and a precharge unit having a data output terminal for receiving the corresponding signal from the transmission date unit and storing an electric charge, the precharge unit maintaining the electric charge at an intermediate level in accordance with the corresponding signal of the transmission gate unit and outputting data at the intermediate level.

In another aspect of the present invention, a circuit includes an output unit for receiving an enable signal and an input data and producing an output signal; a transmission gate unit for receiving a precharge signal and the output signal from the output unit and transmitting a corresponding signal in accordance with the precharge signal, the transmission gate unit including a first inverter having an output terminal for inverting the precharge signal, first and second transmission gates each having first and second gates, the first gate being connected to the precharge signal and the second gate being commonly connected to the output terminal of the first inverter, second and third inverters for inverting respective outputs of the first and second transmission gates, and third and fourth transmission gates respectively connected to the first and second transmission gates, each of the third and fourth transmission gates having third and fourth gates, the third gate being commonly connected to the output terminal of the first inverter and the fourth gate being commonly connected to the precharge signal; and a precharge unit having a data output terminal for receiving the corresponding signal from the transmission date unit and storing an electric charge, the precharge unit maintaining the electric charge at an intermediate level in accordance with the corresponding signal of the transmission gate unit and outputting data at the intermediate level, the precharge unit including a fourth inverter unit having first and second output terminals for inverting the output of the second inverter, a first impedance unit connected to the first output terminal of the fourth inverter unit, a first precharge circuit transistor having a gate connected to the corresponding output of the transmission gate unit, a source connected to a voltage, and a drain connected to the second output terminal of the fourth inverter unit, a fifth inverter unit having first and second output terminals for inverting the output of the third inverter, a second impedance unit connected to the first output terminal of the fifth inverter unit, a second precharge circuit transistor having a gate connected to the corresponding output of the transmission gate unit, a source connected to ground, and a drain connected to the second output terminal of the fifth inverter unit, and a buffer for outputting data in accordance with outputs of the first and second impedance units and the second output terminals of the fourth and fifth inverter units.

In a further aspect of the present invention, a CMOS output circuit with a precharge circuit of the present invention includes an output circuit for operating an output enable signal and an input data; a transmission gate unit for transmitting an output of the circuit unit in accordance with a precharge signal inputted from the interior thereof; and a precharge circuit unit for maintaining an electric charge of an output terminal to an intermediate level in accordance with an output of the transmission gate unit and for outputting an input data at the intermediate level.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4A through 4D illustrate a timing diagram of the circuit in FIG. 3 in accordance to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
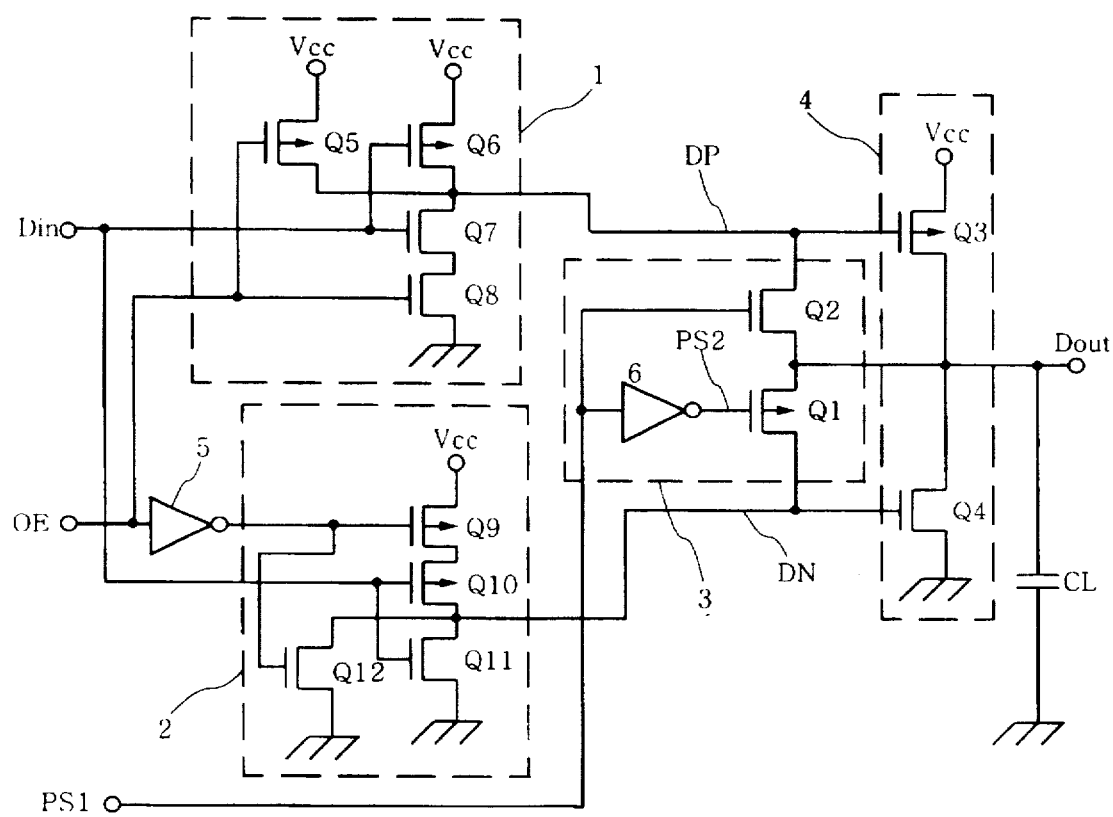
FIG. 1 is a block diagram of a conventional CMOS output circuit with a precharge circuit.
Figure 2:
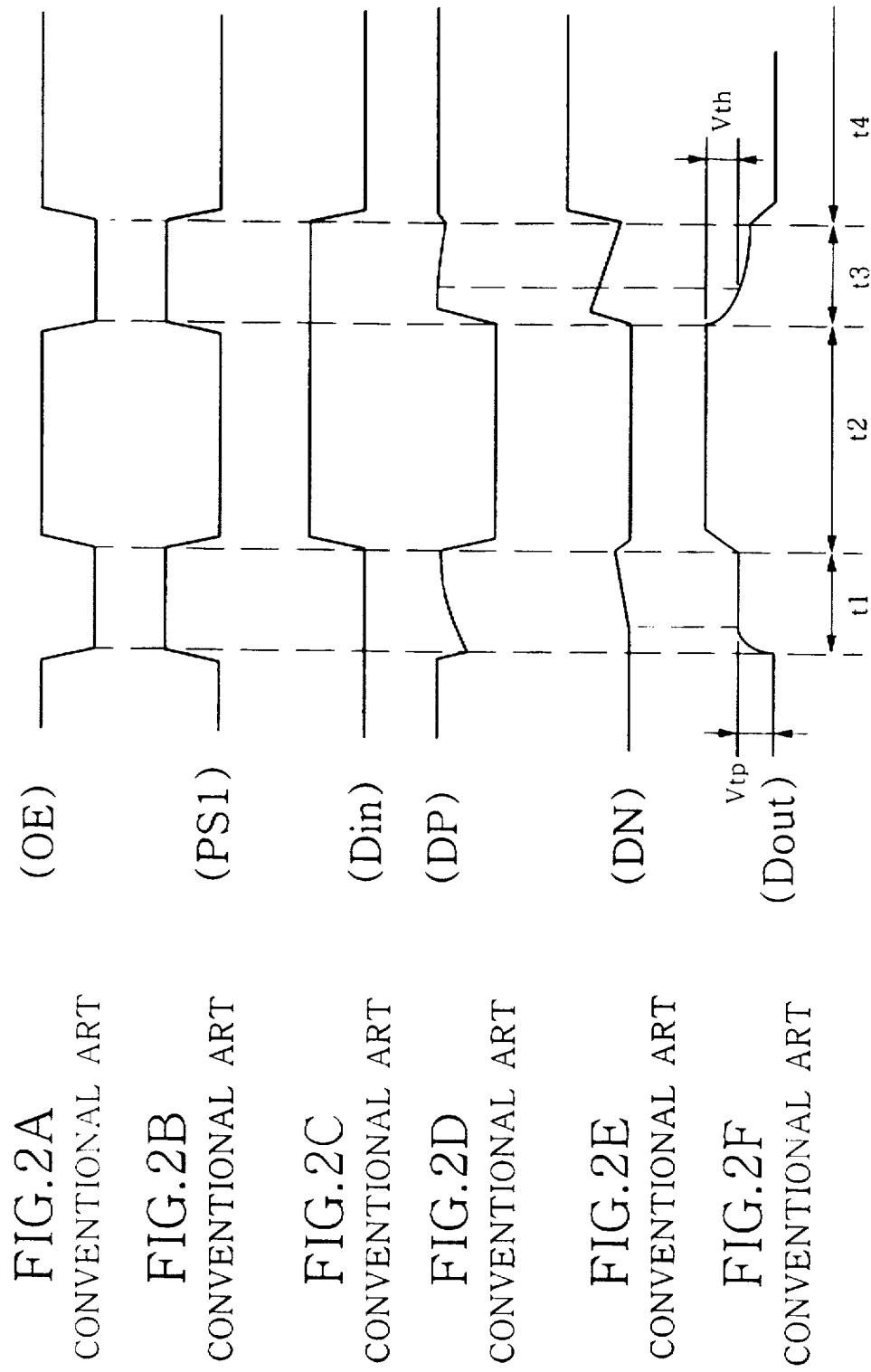
FIGS. 2A through 2F illustrate a timing diagram of the circuit in FIG. 1.
Figure 3:
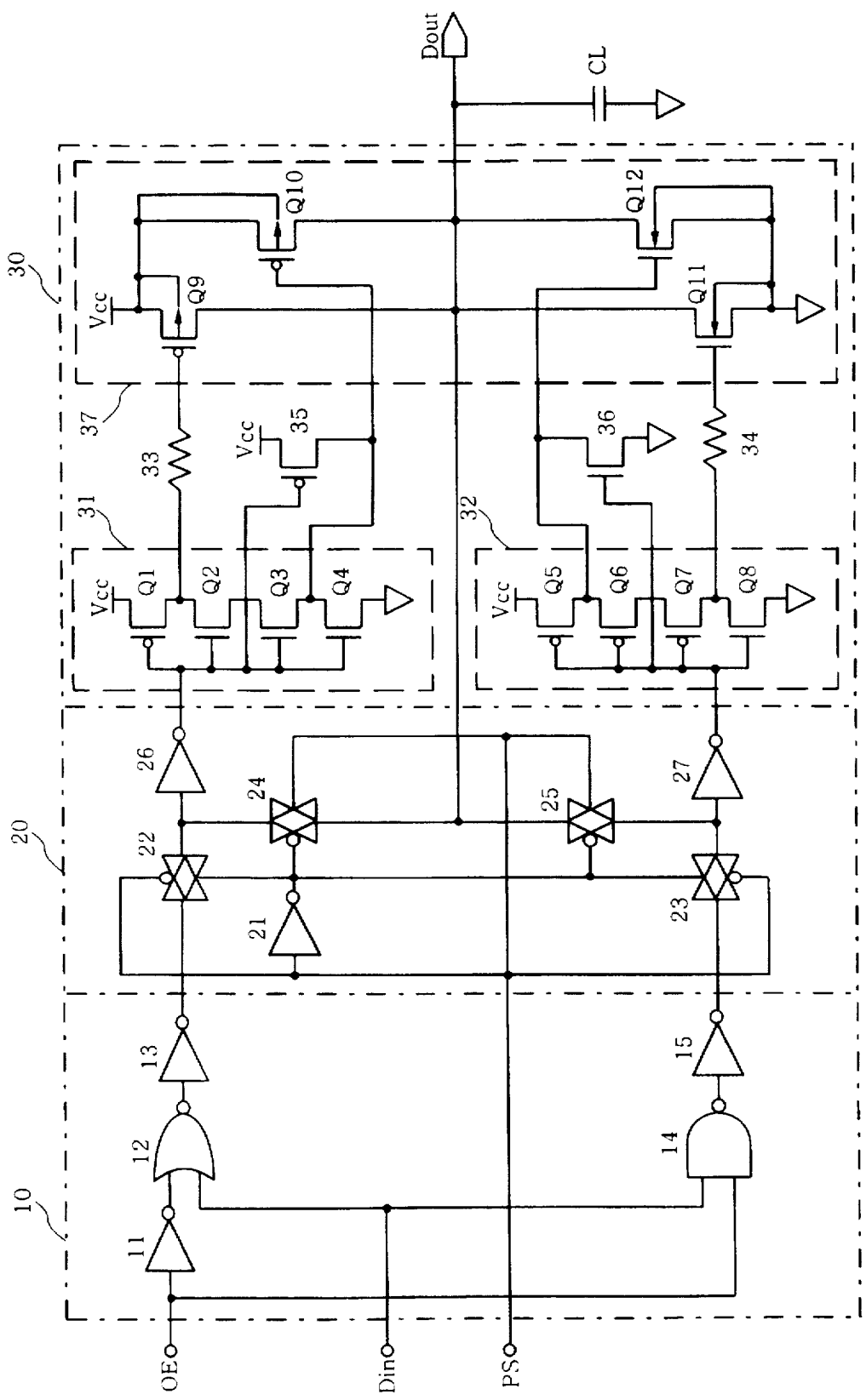
FIG. 3 is a block diagram of a CMOS output circuit with a precharge circuit in accordance with an embodiment of the present invention.

FIG. 3 shows a CMOS output circuit equipped with a precharge circuit according to the present invention. As shown in FIG. 3, an output circuit 10 receives and responds to an output enable signal OE and an input data Din. A transmission gate unit 20 receives the output of the output circuit 10 and transmits signals in accordance with an external precharge signal PS. A precharge circuit 30 retains an electric charge of the output terminal to an intermediate level in accordance with the output of the transmission gate unit 20 and outputs an output data Dout at an intermediate level.

The output circuit 10 includes an inverter 11 for inverting the internal output enable signal OE, a NOR-gate 12 for performing a NOR operation ("NORing") on the output of the inverter 11 and the input data Din, an inverter 13 for inverting the output of the NOR-gate 12. The output circuit 10 also includes a NAND-gate 14 for performing a NAND operation ("NANDing") on the input data Din and the output enable signal OE, and an inverter 15 for inverting the output of the NAND-gate 14.

The transmission gate unit 20 includes an inverter 21 for inverting the precharge signal PS, transmission gates 22 and 23 of which respective PMOS gates are commonly connected to the precharge signal PS terminal, and respective NMOS gates are commonly connected to the output terminal of the inverter 21. Inverters 26 and 27 invert the outputs of the transmission gates 22 and 23 and transmission gates 24 and 25, respectively. Transmission gates 24 and 25 are connected to the transmission gates 22 and 23 in parallel. Respective PMOS gates of transmission gates 24 and 25 are commonly connected to the output terminal of the inverter 21, and respective NMOS gates are commonly connected to the precharge signal terminal PS. In addition, the output terminal Dout is connected between the transmission gates 24 and 25.

The precharge circuit 30 includes an inverter unit 31 for inverting the output of the inverter 26 and an invertor unit 32 for inverting the output of the inverter 27. The inverter unit 31 includes a PMOS transistor Q1 and NMOS transistors Q2, Q3, and Q4 that are connected serially between Vcc and ground. An impedance unit such as a poly resistance (or poly resistance device) 33 is connected to the output terminal of the NMOS transistor Q2, and a PMOS transistor 35 has its gate connected to the output terminal of the inverter 26, its source connected to the voltage Vcc, and its drain connected to the output terminal of the NMOS transistor Q4. The inverter unit 32 includes PMOS transistors Q5, Q6, and Q7 that are connected serially between Vcc and ground. An impedance unit such as a poly resistance 34 is connected to the output terminal of the NMOS transistor Q8, and an NMOS transistor 36 has its gate connected to the output terminal of the inverter 27, its source connected to the ground, and its drain connected to the output terminal of the PMOS transistor Q6. An I/O buffer 37 outputs data in accordance with outputs of the poly resistances 33 and the NMOS transistor Q4 and outputs of the poly resistance 34 and the PMOS transistor Q6.

In addition, the I/O buffer 37 includes a PMOS transistor Q9 having its source connected to the voltage Vcc, its gate connected to the poly resistance 33, and its drain connected to the output terminal Dout. A PMOS transistor Q10 having its source connected to the source of the PMOS transistor Q9, its gate connected to the output terminal of the NMOS transistor Q4, and its drain connected to the output terminal Dout. An NMOS transistor Q11 has its drain connected to the output terminal Dout, its gate connected to the poly resistance 34, and its source connected to the ground. An NMOS transistor Q12 has its drain connected to the output terminal Dout, its gate connected to the output terminal of the PMOS transistor Q6, and its source connected to the ground.

The operation of the CMOS output circuit equipped with a precharge circuit according to the present invention will now be explained with reference to FIGS. 3 and 4A–4D. FIGS. 4A, 4B, 4C, and 4D represent signals for OE, PS, Din, and Dout in FIG. 3, respectively.

Initially, as shown by the interval t1 of FIGS. 4A–4D, the output enable signal OE is set from a high level to a low level (FIG. 4A), and the precharge signal PS is set from a low level to a high level (FIG. 4B). Then, the transmission gates 22 and 23 are turned off in accordance with a high level precharge signal PS, and the transmission gates 24 and 25 are turned on.

Therefore, the output terminal Dout maintains a high level or a low level in accordance with whether the load capacitance CL is charged or discharged, respectively. For example, when the output terminal Dout maintains a high level at an initial stage, the high level is inverted to a low level through the transmission gates 24 and 25 and inverter 26, and is applied to the precharge circuit 30.

Thereafter, the PMOS transistor Q1 of the inverter unit 31 and PMOS transistor 35 are turned on in accordance with the low level signal, and the PMOS transistors Q9 and Q10 of the I/O buffer 37 are turned off. Similarly, the PMOS transistors Q5, Q6, and Q7 of the inverter 32 are turned on in accordance with the low level signal.

When the high level voltage Vcc is applied to the NMOS transistor Q12 through the PMOS transistor Q5, a certain electric charge stored in the load capacitance CL is discharged through the turned-on NMOS transistor Q12, and the electric charge of the output terminal Dout decreases by a threshold voltage Vtn.

In addition, the high level voltage Vcc is delayed by the turn-on resistance of the PMOS transistors Q6 and Q7 and poly resistance 34, and applied to the NMOS transistor Q11. The electric charge stored in the load capacitance CL is discharged through the turned-on NMOS transistor Q11, and the electric charge of the output terminal Dout is quickly reduced by the threshold voltage and maintains an intermediate electric charge. That is, the NMOS transistor Q11 is turned on later than the NMOS transistor Q12 by the delay time of the turn-on resistance of the PMOS transistors Q6 and Q7 and poly resistance 34.

Thereafter, when the output terminal Dout reaches the intermediate electric charge vtp, as shown in the interval t2 of FIG. 4D, the output enable signal OE and the precharge signal PS are changed to a high level and a low level, respectively. When a high level data (Din) is inputted from a sense amplifier (not shown), the transmission gates 24 and 25 are turned off by the low level precharge signal PS, and the transmission gates 22 and 23 are turned on.

In addition, the output of the inverter 11 and the NOR-gate 12 of the output circuit unit 10 become a low level due to the high level output enable signal OE and the high level input data Din, and a high level signal is outputted from the inverter 13. The output of the NAND gate 14 becomes a low level, and a high level signal is outputted from the inverter 15.

Therefore, the high level signal outputted from the inverter 13 is inverted to a low level by the inverter 26 through the transmission gate 22 and applied to the precharge circuit 30. Also, the high level signal outputted from the inverter 15 is inverted to a low level by the inverter 27 through the transmission gate 23 and applied to the precharge circuit unit 30.

Thereafter, the PMOS transistor Q1 of the inverter 31 and PMOS transistor 35 are turned on in accordance with a low level signal outputted from the transmission gate unit 20. Thus, the PMOS transistors Q9 and Q10 of the I/O buffer 37 are turned off. Also, the PMOS transistors Q5, Q6, and Q7 of the inverter 32 are turned on, respectively, in accordance with the low level signal.

Therefore, since the high level voltage Vcc is inputted to the gate of the NMOS transistor Q12 through the PMOS transistor Q5, the electric charge of the output terminal Dout which maintains an intermediate level by the turned-on NMOS transistor Q12 decreases by the threshold voltage Vtn.

Moreover, since the high level voltage Vcc that is applied to the NMOS transistor Q11 is delayed by the turn-on resistance of the PMOS transistors Q6 and Q7 and poly resistance 34, the electric charge of the output terminal Dout decreases by the threshold voltage through the turned-on NMOS transistor Q11. Thus, a low level data is outputted to the I/O apparatus through the output terminal Dout.

In addition, as shown by the interval t3 of FIGS. 4A–4D, when the output enable signal OE is set from the high level to the low level again (FIG. 4A), and when the precharge signal PS is set from the low level to the high level (FIG. 4B), the transmission gates 22 and 23 are turned off in accordance with a high level precharge signal PS, and the transmission gates 24 and 25 are turned on. However, since the output terminal Dout maintains a low level, the low level signal is inverted to a high level by the inverters 26 and 27 through the transmission gates 24 and 25, respectively, and transmitted to the precharge circuit 30.

Therefore, the PMOS transistor Q1 of the inverter 31 is turned off and the NMOS transistors Q2, Q3, Q4 are turned on, and a low level signal is inputted to the gate of the PMOS transistor Q10 of the I/O buffer 37 through the turned-on NMOS transistor Q4. The electric charge of the output terminal Dout increases by the threshold voltage Vtp of the PMOS transistor Q10. The low level signal applied to the PMOS transistor Q9 is delayed by the turn-on resistance and poly resistance 33, and the electric charge of the output terminal Dout increases by the threshold voltage Vtp of the PMOS transistor Q9 and is quickly maintained at an intermediate level. That is, the PMOS transistor Q9 is turned on later than the NMOS transistor Q10 by the delay time of the turn-on resistance of NMOS transistors Q2 and Q3 and poly resistance 33.

Thereafter, as shown by the interval t4, the output enable signal OE is set from the low level to a high level (FIG. 4A), and the precharge signal PS is set from the high level to a low level (FIG. 4B). When the low level data (FIG. 4C) is inputted, the electric charge of the output terminal Dout (FIG. 4D) increases to a high level.

As described above, the CMOS output circuit equipped with a precharge circuit according to the present invention reduces a current noise caused by an input/output buffer (I/O buffer) when outputting data by precharging an output voltage up to an intermediate level and preventing a passing-through current caused between the I/O buffer and the MOS transistor.

It will be apparent to those skilled in the art that various modifications and variations can be made in the CMOS output circuit with precharge circuit of the present invention without departing from the spirit or scope of the invention. Thus, it is intended that the present invention cover the modifications and variations of this invention provided they come within the scope of the appended claims and their equivalents.

What is claimed is:

1. A circuit comprising:

an output unit for receiving an enable signal and an input data and producing an output signal;

a transmission gate unit for receiving a precharge signal and the output signal from the output unit and transmitting first, second, and third corresponding signals in accordance with the precharge signal; and a precharge unit having a data output terminal for receiving the first corresponding signal from the transmission gate unit and storing an electric charge, the precharge unit maintaining the electric charge at an intermediate level in accordance with the first corresponding signal of the transmission gate unit and outputting a signal at the intermediate level.

2. The circuit according to claim 1, wherein the transmission gate unit includes:

a first inverter having an output terminal for inverting the precharge signal;

first and second transmission gates each having first and second gates, the first gate being connected to the precharge signal and the second gate being commonly connected to the output terminal of the first inverter;

second and third inverters for inverting respective outputs of the first and second transmission gates; and third and fourth transmission gates respectively connected to the first and second transmission gates, each of the third and fourth transmission gates having third and fourth gates, the third gate being commonly connected to the output terminal of the first inverter and the fourth gate being commonly connected to the precharge signal.

3. The circuit according to claim 2, wherein the first and second transmission gates are PMOS and NMOS gates, respectively.

4. The circuit according to claim 2, wherein the third and fourth transmission gates are PMOS and NMOS gates, respectively.

5. The circuit according to claim 2, wherein the first and second transmission gates are connected in parallel to the third and fourth transmission gates.

6. The circuit according to claim 1, wherein the precharge unit includes:

a first inverter unit having first and second output terminals for inverting the second corresponding signal of the transmission gate unit;

a first impedance unit connected to the first output terminal of the first inverter unit;

a first precharge circuit transistor having a gate connected to the second corresponding signal of the transmission gate unit, a source connected to a voltage, and a drain connected to the second output terminal of the first inverter unit;

a second inverter unit having first and second output terminals for inverting the third corresponding signal of the transmission gate unit;

a second impedance unit connected to the first output terminal of the second inverter unit;

a second precharge circuit transistor having a gate connected to the second corresponding signal of the transmission gate unit, a source connected to ground, and a drain connected to the second output terminal of the second inverter unit; and a buffer for outputting data in accordance with outputs of the first and second impedance units and the second output terminals of the first and second inverter units.

7. The circuit according to claim 6, wherein the first inverter unit includes a first inverter unit transistor of a first conductivity type and a plurality of second inverter unit transistors of a second conductivity type, the first inverter unit transistor and the second inverter unit transistors being connected serially between the voltage and the ground.

8. The circuit according to claim 7, wherein the first inverter unit transistor includes a PMOS transistor and the plurality of second inverter unit transistors include NMOS transistors.

9. The circuit according to claim 6, wherein the second inverter unit includes a plurality of first inverter unit transistors of a first conductivity type and a second inverter unit transistor of a second conductivity type, the first inverter unit transistors and the second inverter unit transistor being connected serially between the voltage and the ground.

10. The circuit according to claim 9, wherein the plurality of first inverter unit transistors include PMOS transistors and the second inverter unit transistor includes an NMOS transistor.

11. The circuit according to claim 6, wherein the first and second precharge circuit transistors include PMOS and NMOS transistors, respectively.

12. The circuit according to claim 6, wherein the first and second impedance units include poly-resistance devices.

13. The circuit according to claim 6, wherein the buffer is sequentially driven and prevents passing-through current.

14. The circuit according to claim 6, wherein the buffer includes:

a first buffer transistor having a source connected to a voltage terminal, a gate connected to the first impedance unit and a drain connected to the data output terminal of the precharge unit;

a second buffer transistor having a source connected to the voltage terminal, a gate connected to the second output terminal of the first inverter unit, and a drain connected to the data output terminal of the precharge unit;

a third buffer transistor having a drain connected to the data output terminal of the precharge unit, a gate connected to the second impedance unit, and a source connected to the ground; and a fourth buffer transistor having a drain connected to the data output terminal of the precharge unit, a gate connected to the second output terminal of the second inverter unit, and a source connected to the ground.

15. The circuit according to claim 14, wherein the delay circuit delays an activation of the first buffer transistor relative to the second buffer transistor.

16. The circuit according to claim 15, wherein the delay circuit includes the first impedance unit.

17. The circuit according to claim 15, wherein the first inverter unit includes a plurality of transistors and the delay circuit includes one of the transistors from the first inverter unit.

18. The circuit according to claim 14, wherein the delay circuit delays an activation of the third buffer transistor relative to the fourth buffer transistor.

19. The circuit according to claim 18, wherein the delay circuit includes the second impedance unit.

20. The circuit according to claim 18, wherein the second inverter unit includes a plurality of transistors and the delay circuit includes one of the transistors from the second inverter unit.

21. The circuit according to claim 14, wherein the first and second buffer transistors include PMOS transistors and the third and fourth buffer transistors include NMOS transistors.

22. A circuit comprising:

an output unit for receiving an enable signal and an input data and producing an output signal;

a transmission gate unit for receiving a precharge signal and the output signal from the output unit and transmitting a corresponding signal in accordance with the precharge signal, the transmission gate unit including a first inverter having an output terminal for inverting the precharge signal, first and second transmission gates each having first and second gates, the first gate being connected to the precharge signal and the second gate being commonly connected to the output terminal of the first inverter, second and third inverters for inverting respective outputs of the first and second transmission gates, and third and fourth transmission gates respectively connected to the first and second transmission gates, each of the third and fourth transmission gates having third and fourth gates, the third gate being commonly connected to the output terminal of the first inverter and the fourth gate being commonly connected to the precharge signal; and a precharge unit having a data output terminal for receiving the corresponding signal from the transmission date unit and storing an electric charge, the precharge unit maintaining the electric charge at an intermediate level in accordance with the corresponding signal of the transmission gate unit and outputting a signal at the intermediate level, the precharge unit including a first inverter unit having first and second output terminals for inverting an output of the second inverter, a first impedance unit connected to the first output terminal of the first inverter unit, a first precharge circuit transistor having a gate connected to the output of the second inverter of the transmission gate unit, a source connected to a voltage, and a drain connected to the second output terminal of the first inverter unit, a second inverter unit having first and second output terminals for inverting an output of the third inverter, a second impedance unit connected to the first output terminal of the second inverter unit, a second precharge circuit transistor having a gate connected to the output of the third inverter of the transmission gate unit, a source connected to ground, and a drain connected to the second output terminal of the second inverter unit, and a buffer for outputting data in accordance with outputs of the first and second impedance units and the second output terminals of the first and second inverter units.

* * * * *